(12) United States Patent
Auerbach et al.

(10) Patent No.: US 7,649,272 B2
(45) Date of Patent: Jan. 19, 2010

(54) ARRANGEMENT OF AN ELECTRICAL COMPONENT PLACED ON A SUBSTRATE, AND METHOD FOR PRODUCING THE SAME

(75) Inventors: Franz Auerbach, Soest (DE); Karl Weidner, München (DE)

(73) Assignee: Siemens Aktiengesellschaft, Munich (DE)

( * ) Notice: Subject to any disclaimer, the term of this patent is extended or adjusted under 35 U.S.C. 154(b) by 552 days.

(21) Appl. No.: 10/566,438

(22) PCT Filed: Jul. 12, 2004

(86) PCT No.: PCT/EP2004/051460

§ 371 (c)(1),
(2), (4) Date: Jan. 31, 2006

(87) PCT Pub. No.: WO2005/013358

PCT Pub. Date: Feb. 10, 2005

(65) Prior Publication Data

US 2006/0197222 A1 Sep. 7, 2006

(30) Foreign Application Priority Data

Jul. 31, 2003 (DE) ................................. 103 35 155

(51) Int. Cl.
*H01L 23/29* (2006.01)
(52) U.S. Cl. ............... 257/795; 257/789; 257/E23.007; 257/E23.119; 257/E21.505
(58) Field of Classification Search ................. 257/789, 257/795

See application file for complete search history.

(56) References Cited

U.S. PATENT DOCUMENTS 4,811,081 A 3/1989 Lyden
(Continued)

FOREIGN PATENT DOCUMENTS

DE 91 09 295 11/1991
(Continued)

OTHER PUBLICATIONS

Patent Abstract of Japan: JP2003051573, Feb. 21, 2003.
(Continued)

*Primary Examiner*—Wael Fahmy
*Assistant Examiner*—Abul Kalam
(74) *Attorney, Agent, or Firm*—Staas & Halsey LLP

(57) ABSTRACT

An electrical component is placed on a substrate. At least one film comprising a plastic material is connected to the component and to the substrate in such a way that a surface contour defined by the component and the substrate is represent is represented in a surface contour of the part of the film. Said film is laminated onto the component and the substrate in such a way that the film follows the topology of the arrangement consisting of the component and the substrate. Said film is in contact with the component and the substrate in a positive and non-positive manner, and comprises a composite material containing a filler that is different to the plastic material. The processability and electrical properties of the film are influenced by the filler or the composite material obtained thereby. In this way, other functions can be integrated into the film. Said component is, for example, a power semiconductor component. An electrically insulating and thermoconductive film is used, for example. A contact surface of the power semiconductor is electrically contracted through the film. The thermal conductivity of the film enables heat created during the operation of the power semiconductor component to be efficiently carried away.

15 Claims, 1 Drawing Sheet

U.S. PATENT DOCUMENTS

| | | |
|---|---|---|
| 5,026,748 A | 6/1991 | Adams et al. |
| 5,357,401 A | 10/1994 | Göbl et al. |
| 5,449,427 A | 9/1995 | Wojnarowski et al. |
| 5,637,922 A | 6/1997 | Fillion et al. |
| 5,641,997 A * | 6/1997 | Ohta et al. ............ 257/788 |
| 5,675,310 A | 10/1997 | Wojnarowski et al. |
| 5,695,872 A | 12/1997 | Ideler et al. |
| 5,989,942 A * | 11/1999 | Ishikawa et al. ............ 438/127 |
| 6,160,714 A | 12/2000 | Green |
| 6,469,086 B1 | 10/2002 | Neu et al. |
| 6,541,378 B1 | 4/2003 | Foust et al. |
| 2004/0007784 A1* | 1/2004 | Skipor et al. ............ 257/788 |
| 2004/0089956 A1 | 5/2004 | Ramin |
| 2005/0032347 A1 | 2/2005 | Hase et al. |
| 2005/0110112 A1 | 5/2005 | Ramin |

FOREIGN PATENT DOCUMENTS

| | | |
|---|---|---|
| DE | 691 13 108 | 11/1991 |
| DE | 91 13 276 | 4/1992 |
| DE | 44 01 608 | 7/1995 |
| DE | 198 00 462 | 4/1999 |
| DE | 197 56 887 | 7/1999 |
| DE | 102 35 771 | 2/2004 |
| EP | 0 110 285 | 6/1984 |
| GB | 2 269 059 | 1/1994 |
| JP | 09 14870 | 6/1997 |
| JP | 2003 051573 | 2/2003 |
| WO | 03/030247 | 4/2003 |

OTHER PUBLICATIONS

Patent Abstract of Japan: JP 09 14870, Jun. 6, 1997.

* cited by examiner

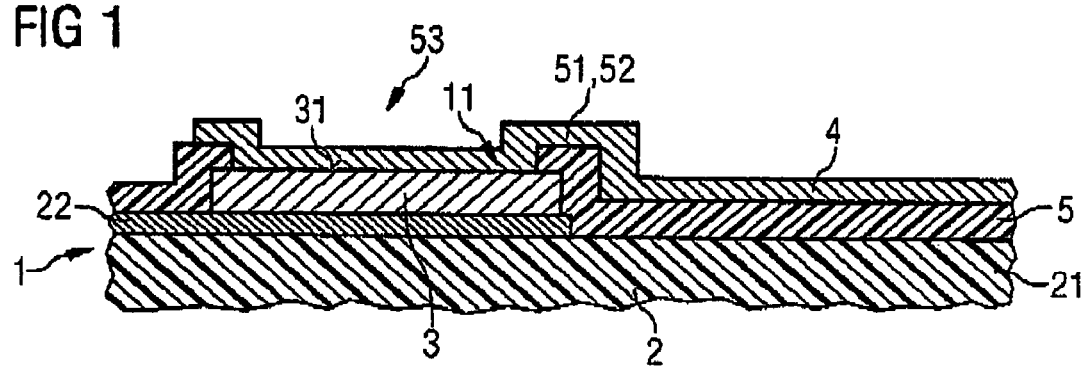
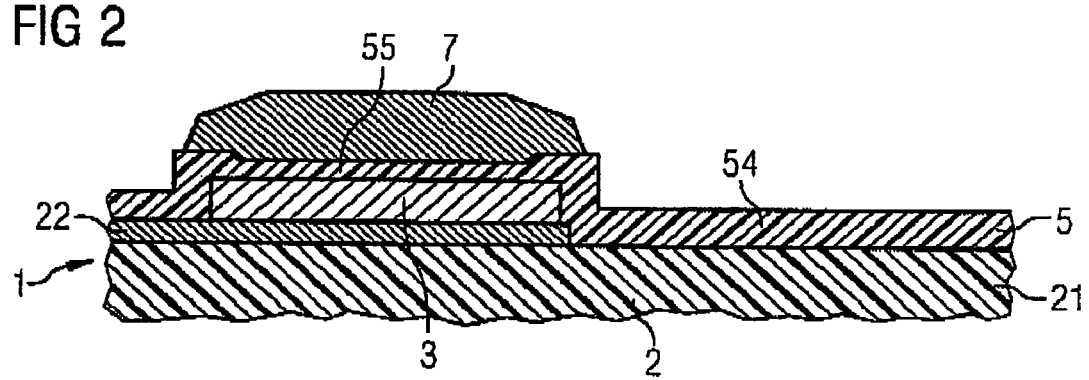
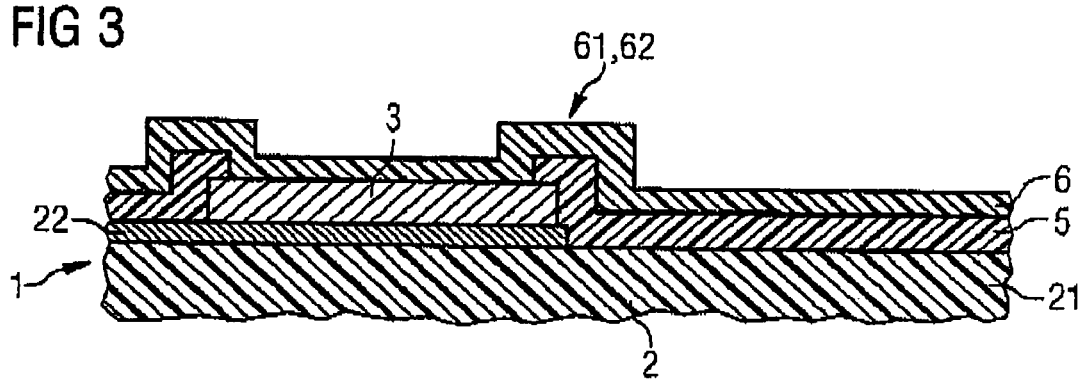

US 7,649,272 B2

ARRANGEMENT OF AN ELECTRICAL COMPONENT PLACED ON A SUBSTRATE, AND METHOD FOR PRODUCING THE SAME

CROSS REFERENCE TO RELATED APPLICATIONS

This application is based on and hereby claims priority to PCT Application No. PCT/EP2004/051460 filed on Jul. 12, 2004 and German Application No. 10335155.8 filed Jul. 31, 2003, the contents of which are hereby incorporated by reference.

BACKGROUND OF THE INVENTION

The invention relates to an arrangement of an electrical component on a substrate, a film comprising a plastic material being present and at least one part of the film being connected to the component and the substrate such that a surface contour defined by the component and the substrate is mapped in a surface contour of the part of the film. A method for producing the said arrangement is also specified.

Such an arrangement and a method for producing the said arrangement are known for example from WO 03/030247 A2. The substrate is for example a DCB (Direct Copper Bonding) substrate, comprising a support layer made of a ceramic material, to both sides of which electrically conductive copper layers are attached. A semiconductor component is for example soldered to one of these electrically conductive copper layers such that an electrical contact surface of the semiconductor component is present facing away from the substrate.

A polyimide or epoxy resin based film is vacuum-laminated to this arrangement comprising the semiconductor component and the substrate, such that the film is connected with close contact to the semiconductor component and the substrate. The film is connected in a positive and non-positive manner to the semiconductor component and the substrate. The surface contour (topology) defined by the semiconductor component and the substrate is mapped in the surface contour of the film. The film follows the surface contour of the semiconductor component and the substrate.

The film of the known arrangement comprises an electrically insulating plastic material. A window is opened in the film for electrical contact with the contact surface of the semiconductor component. This exposes the contact surface of the semiconductor component. Electrically conductive material is then applied to the contact surface.

The film is only used to produce the electrical contact and to insulate the component electrically. It is not possible to integrate a further functionality, for example cooling of the semiconductor component, in the multilayer structure with the known film.

SUMMARY OF THE INVENTION

One possible object of the present invention is therefore to demonstrate how a plurality of functionalities can be integrated in a simple manner into the known multilayer structure.

To achieve the said object, an arrangement of an electrical component on a substrate is specified, with a film comprising a plastic material being present and at least one part of the film being connected to the component and the substrate, such that a surface contour defined by the component and the substrate is mapped in a surface contour of the part of the film. The arrangement is characterized in that the film comprises a composite material as well as the plastic material and at least one filler material that is different from the plastic material.

To achieve the object a method for producing the said arrangement is specified with the steps: a) preparation of an arrangement of at least one electrical component on a substrate and b) laminating the film with the composite material onto the component and the substrate, such that the surface contour defined by the component and the substrate is mapped in the surface contour of the film.

The composite material comprises the plastic material and the filler material. The plastic material forms a matrix, in which the filler material is embedded. The filler material does not thereby primarily serve as an elongation agent. Rather the filler material allows a chemical, electrical and/or mechanical characteristic to be achieved, which could not be achieved with a plastic material alone. Thus the filler can be used to improve the chemical resistance of the composite material to a reactive substance. Improved adhesion of the film to the semiconductor component and/or the substrate can also be achieved. It is also possible to use an electrically and/or thermally conductive filler material, resulting in an electrically and/or thermally conductive composite material. Corresponding filler materials can also be added to influence the module of elasticity of the film material of the film. It is possible to use the filler material to increase or reduce the elasticity of the film compared with a film made of a pure base material. Further characteristics of the composite material or film made from the composite material that can be influenced with the aid of the filler material are compression characteristics, gas permeability, pressure resistance, dimensional response and dielectric coefficient of the composite material of the film. These characteristics relate both to the working properties of the film and also to the function of the film in the finished multilayer structure. By using a mixture of a plurality of filler materials, it is possible to influence a plurality of characteristics of the film in the required manner at the same time.

Any organic or inorganic filler material can be used as the filler material. The filler material itself is by way of example an organic polymer (plastic material). The inorganic filler material can be any metal. Inorganic compounds, e.g. carbonates, oxides, sulfides, etc., can also be used. Finally organometallic compounds can also be used as the filler material, for example organic silicon compounds.

The filler material is preferably in powder and/or fiber form. The diameter of the filler material particles is a few nm to several μm. Like the type of filler material and the quantity of filler material in the base material, the diameter of the filler material particles is dimensioned such that a composite material with a specific characteristic and therefore a film with a specific characteristic result. The type, form and quantity of the filler material in particular are selected such that the film can be laminated into place. This means that the elasticity of the film is maintained even in the presence of the filler material, so that the film can follow the surface contour of the component and the substrate. The film is thereby in particular configured such that a height difference of up to 500 μm can be overcome. The height difference is for example defined by the topology of the substrate and by the components attached to the substrate.

In a particular embodiment the filler material is electrically and/or thermally conductive. The plastic material, which forms the base material of the composite material, is generally characterized by a relatively low thermal and/or electrical conductivity. The embedding of the electrically and/or thermally conductive filler material allows a composite material with precisely these characteristics to be obtained. The content (quantity) of filler material in the plastic material can thereby be selected such that the coagulation limit of the filler material in the base material is not reached. The relatively low content means that there is initially no electrical or thermal conductivity. By compressing the filler material in the composite material, for example by applying an external pressure to the film, it is possible to exceed the coagulation limit. Above the coagulation limit the filler material particles in the base material make contact with each other, such that compression ensures thermal and/or electrical conductivity through the film. It is then for example possible with the semiconductor component referred to above to achieve electrical contact with the contact surface of the component without exposing the contact surface and then applying an electrically conductive material. To this end it is possible to exert an additional pressure during and/or after lamination into place of the film at the point of the contact surface of the semiconductor component, resulting in compression of the filler material in this region of the film.

Using a film with a thermally conductive filler material means that it is possible to dissipate heat resulting during operation of the component from the said component. The thermal conductivity $\lambda$ of the filler material at room temperature is at least $1\ W.m^{-1}.K^{-1}$. For efficient heat dissipation the film is connected to a heat sink in a thermally conductive manner. To increase thermal conductivity whilst at the same time keeping electrical conductivity low, a filler made of a ceramic material can be used. Such a material is for example powdered aluminum oxide ($Al_2O_3$).

To achieve electrical or thermal conductivity, the filler material for example comprises a powdered metal. To this end it is also possible in particular to use carbon nanotubes, which have an electrical and thermal characteristic comparable to metals.

In a particular embodiment a coefficient of thermal expansion of the composite material is adjusted to a coefficient of thermal expansion of a material of the component. This means that no thermally induced stresses occur, despite thermal loading of the arrangement. The positive and non-positive composite of the film and component or the film and substrate is maintained. This results in an arrangement that is stable even over a wide temperature range.

The component is for example a power semiconductor component with a silicon base. Silicon has a coefficient of thermal expansion of around 10 ppm/K. Films without a filler material generally have a coefficient of thermal expansion of more than 100 ppm/K. The inclusion of a filler material with a relatively low coefficient of thermal expansion allows the coefficient of thermal expansion of the composite material of the film to be reduced. In particular it is then possible to achieve a coefficient of thermal expansion in the range of 7 ppm/K to 50 ppm/K.

In a particular embodiment at least one further film is present and at least one further part of the further film is connected to the component and the substrate such that the surface contour of the component and the substrate is mapped in a further surface contour of the further part of the further film. There is then a multilayer structure. The plastic material of the further film can be the same plastic material or a different further plastic material from the plastic material of the film. The film may thereby only comprise the plastic material. A further film, which also comprises a composite material, is also possible. A further function can thus be integrated in the multilayer structure with the further film. For example one of the films can have high thermal conductivity. In contrast the further film is characterized by a corresponding electrical conductivity. Further characteristics, for example an ability to screen electromagnetic radiation, can also be integrated in the multilayer structure in this manner. It is particularly advantageous if a coefficient of thermal expansion of the further composite material of the further film is also adjusted to the coefficient of thermal expansion of the material of the component. It results in a reliable multilayer structure scarcely affected by thermal stresses.

With the multilayer structure the further film can be applied to the substrate, which is disposed directly on the substrate and the surface section. It is also possible for the further film to be disposed between the film and the substrate or the component on the substrate. It is also possible to dispose any number of films with the same, similar or different functions one on top of the other.

The component can be any passive and/or active electrical component. It is preferred that a semiconductor component is used as the component. The semiconductor component is preferably a power semiconductor component selected from the MOSFET, IGBT and/or bipolar transistor group. The arrangement described above is particularly suitable for such components on a substrate. The film with filler materials can thus be used to achieve electrical contact with different contact surfaces of the semiconductor components in a simple manner. Further functions, such as thermal dissipation, can also be integrated in the multilayer structure.

The lamination into place of the film results in a close and permanent contact between the film and the component and between the film and the substrate. If the film completely covers the component due to lamination, the component can be hermetically shielded in this manner from outside influences. It is for example possible to prevent water penetrating, for example from a humid atmosphere, to the component.

In a particular embodiment of the production method, the film is vacuum-laminated into place. This produces a particularly close and permanent contact between the film and the substrate and the component. Vacuum-lamination can be used to ensure that the surface contour defined by the substrate and the component is traced by the film. The surface contour of the film follows the surface contour of the component and the substrate. Lamination advantageously takes place in a vacuum press. Vacuum drawing, hydraulic vacuum compression, vacuum gas pressure compression and similar lamination methods are also possible. The pressure is advantageously applied isostatically. Lamination takes place for example at temperatures of 100° C. to 250° C. and a pressure of 1 to 10 bar. The precise process parameters of the lamination process, i.e. pressure, temperature, time, etc., depend for example on the surface contour of the substrate, the composite material of the film and the thickness of the film.

A film thickness from the range 25 µm to 150 µm has proven particularly advantageous. Bigger thicknesses of up to 500 µm are also possible. A plurality of thin films can be laminated on to achieve a specific overall thickness.

In a particular embodiment a tempering step is carried out during and/or after the lamination into place of the film. It is for example possible to use a film with a plastic that is not or is only partially cross-linked. Increasing the temperature accelerates the cross-linking of the plastic material. The further cross-linking of the plastic material produces the close contact between the film and the substrate and the component. As well as continuing polymerization by increasing the temperature, it is also possible to continue the polymerization process by light exposure.

To improve the adhesion of the film to the component and the substrate, a layer of primer can be applied to the film and/or to the component or the substrate before lamination. Any single-component or multi-component adhesive can be used for this. A primer containing a polysilane has proven particularly advantageous. The primer allows not only a positive and a non-positive contact to be produced but also a material contact.

The plastic material can be any duroplastic and/or thermoplastic material. A film with at least one plastic material selected from the polyimide, polyethylene, polyphenol, polyetheretherketone and/or epoxy resin group is preferably used. The film can thereby contain mixtures of the said plastic materials. Copolymerisates are also possible with these plastic materials. Films with a halogen-free plastic material are used in particular with respect to environmental sustainability. Such films contain almost no halogens.

To summarize, the following advantages may result:
the use of films containing filler materials means that the widest range of characteristics of the films can be influenced in the required manner.
films with different functions mean that different functions can be integrated in the multilayer structure.
a compact module with a simple structure can be produced in particular for the electrical insulation of power semiconductor components in combination with thermal contact with the power semiconductor components.
adjusting the coefficient of thermal expansion to the material of the component significantly increases the reliability of the multilayer structure.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 1 to 3 each show a lateral section of an arrangement of an electrical component on a substrate.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

The arrangement 1 comprises an electrical component 3 on a substrate 2. The substrate 2 is a DCB substrate with a support layer 21 made of a ceramic material and an electrically conductive layer made of copper attached to the support layer 21.

A power semiconductor component 3 in the form of a MOSFET is soldered onto the electrically conductive layer 22 made of copper such that a contact surface 31 of the power semiconductor component faces away from the substrate 2. Electrical contact is made with one of the contacts of the power semiconductor component 3 (source, gate, drain) via the contact surface 31.

A connecting line 4 is present on the substrate 2 for electrical contact with the contact surface 31 of the power semiconductor component 3. The connecting line 4 is thereby used for electrical contact with the contact surface 31 of the semiconductor component 3.

A roughly 50 μm thick film 5 comprising a composite material is laminated onto the substrate 2 and the power semiconductor component 3 such that the surface contour 11, resulting from the power semiconductor component 3, the electrically conductive layer 22 and the support layer 21 of the DCB substrate, is mapped in the surface contour 51 of a part 52 of the film 5.

To produce the circuit arrangement 1, the power semiconductor component 3 is soldered onto the electrically conductive layer 22 of the DCB substrate 2 such that the contact surface 31 of the power semiconductor component 3 faces away from the substrate 2.

The film 5 is then vacuum-laminated onto the contact surface 31 of the power semiconductor component 3 and the substrate 2. This produces a close connection between the film 5 and the power semiconductor component 3 or the substrate 2. A positive and non-positive contact results between the film 5 and the component 3 or the substrate 2. The film 5 is connected to the semiconductor component 3 and the substrate 2 such that the surface contour 11, which is essentially defined by the form of the semiconductor component 3, is traced.

EXAMPLE 1

The composite material of the film 5 has a polyimide plastic material as its base material. Powdered aluminum oxide is contained in the plastic material as a filler material. The particle size and quantity of the aluminum oxide powder is thereby selected such that a coagulation limit is exceeded. The thermal conductivity of the aluminum oxide produces a film 5, via which heat resulting during operation of the power semiconductor component 3 can be dissipated via a heat sink (not shown).

According to a first embodiment a window 53 is then opened in the film 5 by laser ablation with the aid of a $CO_2$ laser (FIG. 1). This exposes the contact surface 31 of the power semiconductor component 3. A thin layer (not shown) made of an electrically conductive material made of a titanium-copper alloy is then deposited by precipitation from the vapor phase on the contact surface 31 and on regions of the film 5 made of electrically insulating material. To increase current carrying capacity a layer made of copper is then deposited by electroplating on the layer made of the titanium-copper alloy. This forms the connecting line 4. The result is an arrangement comprising a power semiconductor component 3 on a substrate 2, onto which a film 5 is laminated. Electrical contact is made with the contact surface 31 of the power semiconductor component 3 through the window 53 in the film. The film 5 encloses the power semiconductor component 3 such that electrical insulation of the power semiconductor component 3 is ensured. This relates in particular to the further electrical contact surfaces (not shown) of the power semiconductor component 3. At the same time the relatively high thermal conductivity of the aluminum oxide allows the efficient dissipation of heat resulting during operation of the power semiconductor component. The coefficient of thermal expansion of the composite material of the film 5 is also adjusted by the filler material to that of the silicon in the power semiconductor component 3. This produces a stable structure with the film 5 laminated onto the power semiconductor component 3 and onto the substrate 2.

EXAMPLE 2

In contrast to the previous example the filler material is a powdered metal. The film 5 has a first region 54, in which the quantity or density of the filler material in the plastic matrix made of polyimide is so small that the coagulation limit is not reached. In the first region 54 the film 5 is electrically insulating. Electric current is not conducted through the film 5. In addition to the first region 54 the film 5 has a second region 55. This second region 55 is disposed over the contact surface 31 of the power semiconductor component 3. In the second region 55 the quantity or density of the filler material in the plastic matrix is so great that the coagulation limit is exceeded. In this second region 55 current can be conducted through the film 5. As the second region 55 is disposed over the contact surface 31 of the power semiconductor component 3, corresponding contact can be activated electrically via the second region 55 of the film 5.

To produce the arrangement 1 according to this example a film 5 with a corresponding composite material is laminated into place. In the second region 55 of the film 5, through which electrical contact is to be established with the contact surface 31 of the power semiconductor component, pressure is applied during lamination with the aid of a stamp such that it causes compression of the filler material in this second region 55 of the film 5. Compression causes the coagulation limit to be exceeded. Current can be conducted through the film 5 in this region 55. To increase current carrying capacity, a copper layer more than 100 μm thick is deposited on the second region 55 of the film 5 by electroplating.

EXAMPLE 3

A multilayer structure is present. In addition to the film 5, a further film 6 is laminated onto the arrangement of the power semiconductor component 5 on the substrate 2 such that the surface contour resulting from the power semiconductor component 3, the electrically conductive layer 22 and the support layer 21 of the DCB substrate, is mapped in the further surface contour 61 of a further part 62 of the film 6.

The film 5 comprises a composite material according to example 1. This means that the film 5 is electrically insulating and thermally conductive. The further film 6 comprises a composite material, the base material of which is also a polyimide. This polyimide contains carbon nanotubes in such quantities that the coagulation limit is exceeded. This means that the further film is electrically conductive.

See example 1 for production of the arrangement 1. After the window 53 in the film 5 has been opened, the further film 6 is laminated into place. The electrical conductivity of the material of the further film 6 means that electrical contact is made with the contact surface of the power semiconductor component.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. An electrical device comprising:
    a substrate;
    an electrical component mounted on the substrate, the substrate and the electrical component defining a surface contour; and
    a covering film having at least one part connected to the electrical component and to the substrate such that the surface contour defined by the electrical component and the substrate is mapped in a surface contour of the covering film, wherein
    the covering film is formed of a composite material comprising a plastic material and at least one filler material that is different from the plastic materials,
    the electrical device has an additional film formed on at least part of the electrical component and at least part of the substrate such that the surface contour of the electrical component and the substrate is mapped in a surface contour of the additional film, and
    the additional film is formed of a composite material comprising a filler material that is different from the filler material of the covering film.

2. The electrical device according to claim 1, wherein the composite material of the covering film has a coefficient of thermal expansion that substantially matches a coefficient of thermal expansion of the electrical component.

3. The electrical device according to claim 2, wherein the coefficient of thermal expansion of the composite material of the covering film is in a range from 7 ppm/K to 50 ppm/K.

4. The electrical device according to one of claims 1, wherein the filler material of the covering film is thermally and/or electrically conductive.

5. The electrical device according to one of claims 1, wherein the filler material of the covering film is in a powder and/or fiber form.

6. The electrical device according to one of claims 1, wherein the electrical component is a semiconductor component.

7. The electrical device according to claim 6, wherein the semiconductor component is a power semiconductor component selected from the group consisting of MOSFET components, IGBT components and bipolar transistor components.

8. The electrical device according to one of claims 3, wherein the filler material of the covering film is thermally and/or electrically conductive.

9. The electrical device according to one of claims 8, wherein the filler material of the covering film is in a powder and/or fiber form.

10. A method for producing an electrical device, comprising:
    forming an electrical component on a substrate such that the substrate and the electrical component define a surface contour; and
    laminating a covering film onto at least part of the electrical component and at least part of the substrate, such that the surface contour defined by the electrical component and the substrate is mapped in a surface contour of the covering film, the covering film being formed of a composite material comprising a plastic material and at least one filler material that is different from the plastic material, wherein
    the electrical device has an additional film formed on at least part of the electrical component and at least part of the substrate such that the surface contour of the electrical component and the substrate is mapped in a surface contour of the additional film, and
    the additional film is formed of a composite material comprising a filler material that is different from the filler material of the covering film.

11. The method according to claim 10, wherein the covering film is laminated using a vacuum-lamination technique.

12. The method according to claim 10, wherein a tempering step is performed during and/or after laminating the covering film.

13. The method according to claim 10, wherein the plastic material used to form the covering film is at least one plastic material selected from the group consisting of a polyimide, a polyethylene, a polyphenol, a polyetheretherketone and an epoxy resin.

14. The method according to claim 10, wherein
the composite material forming the additional film comprises a plastic material and the filler material that is different from the filler material of the covering film, and
the plastic material used to form the additional film is at least one plastic material selected from the group consisting of a polyimide, a polyethylene, a polyphenol, a pelyetheretherketone and an epoxy resin.

15. The method according to claim 11, wherein a tempering step is performed during and/or after laminating the covering film.

* * * * *